United States Patent
Otto et al.

(10) Patent No.: US 10,903,119 B2
(45) Date of Patent: Jan. 26, 2021

(54) SEMICONDUCTOR CHIP, METHOD OF PRODUCING A SEMICONDUCTOR CHIP AND APPARATUS HAVING A PLURALITY OF SEMICONDUCTOR CHIPS

(71) Applicant: OSRAM Opto Semiconductors GmbH, Regensburg (DE)

(72) Inventors: Isabel Otto, Regensburg (DE); Patrick Rode, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 82 days.

(21) Appl. No.: 16/078,995

(22) PCT Filed: Jun. 21, 2017

(86) PCT No.: PCT/EP2017/065286
§ 371 (c)(1),
(2) Date: Aug. 22, 2018

(87) PCT Pub. No.: WO2018/007151
PCT Pub. Date: Jan. 11, 2018

(65) Prior Publication Data
US 2020/0168505 A1    May 28, 2020

(30) Foreign Application Priority Data

Jul. 8, 2016    (DE) .................. 10 2016 112 584

(51) Int. Cl.
*H01L 29/06*    (2006.01)
*H01L 21/78*    (2006.01)
(Continued)

(52) U.S. Cl.
CPC .............. *H01L 21/78* (2013.01); *H01L 21/28* (2013.01); *H01L 23/538* (2013.01)

(58) Field of Classification Search
CPC . H01L 21/78; H01L 23/544; H01L 21/30604; H01L 21/31144; H01L 21/6836;
(Continued)

(56) References Cited

U.S. PATENT DOCUMENTS 7,205,578 B2    4/2007    Eisert et al.
8,154,040 B2    4/2012    Sorg et al.
(Continued)

FOREIGN PATENT DOCUMENTS

DE    102007021009 A1    4/2008
DE    102013111503 A1    4/2015
(Continued)

*Primary Examiner* — Theresa T Doan
(74) *Attorney, Agent, or Firm* — Slater Matsil, LLP (57) ABSTRACT

A semiconductor chip, a method for producing a semiconductor chip and an apparatus having a plurality of semiconductor chips are disclosed. In an embodiment a chip includes a substrate and a semiconductor layer arranged at the substrate, wherein the substrate includes, at a side facing the semiconductor layer, a top side with a width B1 in a first lateral direction and, at a side opposite to the top side, a bottom side with a width B3 in the first lateral direction, wherein the substrate has a width B2 in the first lateral direction at a half height between the top side and the bottom side, and wherein the following applies to widths B1, B2 and B3: $B1-B2 < B2-B3$, and $B1 \geq B2 > B3$.

15 Claims, 6 Drawing Sheets

(51) Int. Cl.
*H01L 21/28* (2006.01)
*H01L 23/538* (2006.01)

(58) Field of Classification Search
CPC ............. H01L 23/528; H01L 21/31138; H01L 21/32139; H01L 21/31116; H01L 21/28; H01L 21/2815; H01L 21/30608; H01L 21/743; H01L 21/76232; H01L 21/784; H01L 23/538; H01L 23/5389
USPC .......................................................... 257/618
See application file for complete search history.

(56) References Cited

U.S. PATENT DOCUMENTS

| | | | |
|---|---|---|---|
| 2011/0215350 A1* | 9/2011 | Song ..................... | H01L 33/20 257/93 |
| 2013/0277756 A1* | 10/2013 | Kawano ................... | G03F 7/20 257/384 |
| 2016/0133476 A1 | 5/2016 | Takahashi et al. | |
| 2016/0254415 A1 | 9/2016 | Kaempf et al. | |

FOREIGN PATENT DOCUMENTS

| | | |
|---|---|---|
| EP | 2276075 A1 | 1/2011 |
| WO | 2013074370 A1 | 5/2013 |

\* cited by examiner

SEMICONDUCTOR CHIP, METHOD OF PRODUCING A SEMICONDUCTOR CHIP AND APPARATUS HAVING A PLURALITY OF SEMICONDUCTOR CHIPS

This patent application is a national phase filing under section 371 of PCT/EP2017/065286, filed Jun. 21, 2017, which claims the priority of German patent application 10 2016 112 584.9, filed Jul. 8, 2016, each of which is incorporated herein by reference in its entirety.

TECHNICAL FIELD

The present invention relates to a semiconductor chip, a method for producing a semiconductor chip and an apparatus with a plurality of semiconductor chips.

BACKGROUND

For the production of semiconductor chips usually a wafer is produced with a variety of desired semiconductor structures, said wafer then being singulated by means of splitting it up into a plurality of individual semiconductor chips. For this typically a laser separation process is used, in which a laser severs all layers including already applied metallic contact layers. However, this requires relatively wide mesa trenches between adjacent semiconductor chips. The laser separation also causes mechanical damage at the chip edges and in the resulting melt. This reduces the breakage stability of the chips. In addition, the metallic contact layers terminate flush with the chip edges, so that there is a risk of short-circuiting these in a close assembly of two or more semiconductor chips.

SUMMARY OF THE INVENTION

Embodiments provide a semiconductor chip. Further embodiments provide a method of manufacturing a semiconductor chip. Yet various additional embodiments provide an apparatus with a plurality of semiconductor chips.

According to at least one embodiment, a semiconductor chip comprises a substrate and a semiconductor layer applied to the substrate. The semiconductor layer may in particular also be formed as a semiconductor layer sequence with a plurality of semiconductor layers, which is applied to the substrate. If, in the following, it is not expressly described otherwise, for example, with regard to individual embodiments or features, the term "semiconductor layer" therefore includes a single layer as well as a semiconductor layer sequence having two or more semiconductor layers.

According to at least one further embodiment, a method for producing a semiconductor chip comprises at least one method step in which a substrate wafer is provided with a semiconductor layer applied thereon in large-area fashion. In a further method step, the substrate wafer and the semiconductor layer applied thereon are severed and thus are singulated into individual semiconductor chips.

According to at least one further embodiment, an apparatus comprises a carrier and a plurality of semiconductor chips on the carrier.

The features and embodiments described above and in the following equally apply to the semiconductor chip, the method for producing the semiconductor chip as well as to the apparatus with the plurality of semiconductor chips.

According to a further embodiment, the semiconductor chip is embodied as an optoelectronic semiconductor chip. In particular, the semiconductor chip in this case may be a light-emitting and/or light-detecting semiconductor chip, that is, for example, a light-emitting diode, a laser diode, a photodiode or a solar cell. Alternatively, the semiconductor chip can also be embodied as an electronic semiconductor chip without optoelectronic properties, for example, as a transistor or as an integrated circuit. In addition, also mixed forms and combinations of the mentioned functionalities are possible. The semiconductor chip may be based on a nitridic, phosphidic and/or arsenidic compound semiconductor material, thus can comprise at least one semiconductor layer or a semiconductor layer sequence having a plurality of semiconductor layers, which is based on $In_xAl_yGa_{1-x-y}N$, $In_xAl_yGa_{1-x-y}P$ and/or $In_xAl_yGa_{1-x-y}As$, each with $0 \leq x \leq 1$, $\leq y \leq 1$ and $x+y \leq 1$. In addition, the semiconductor chip may also be formed on a silicon basis and/or a germanium basis and accordingly have at least one semiconductor layer or a semiconductor layer sequence with a plurality of semiconductor layers, which are based on silicon and/or germanium. Furthermore, other semiconductor materials are possible, for example, II-VI compound semiconductor material systems. The semiconductor layer applied on the substrate may be formed according to the desired functionality of the semiconductor chip and can comprise, for example, one or more active layers, for example, in the case of an optoelectronic semiconductor chip for light generation and/or light detection, and/or other functional layers and functional areas, such as p- and/or n-doped charge carrier transport layers, undoped and/or p- and/or n-doped confinement, cladding and/or waveguide layers, barrier layers, planarization layers, buffer layers and/or protective layers. In addition, the semiconductor chip can have one or more contact metallizations, by means of which the semiconductor chip can be electrically contacted.

Furthermore, by means of an epitaxy process, for example, organometallic gas phase epitaxy (MOVPE) or molecular beam epitaxy (MBE), the semiconductor layer can be grown on the substrate wafer, which is embodied as a growth substrate wafer, and can be provided with contact metallizations. Alternatively, after growth and before singulation, the semiconductor layer can be transferred to a substrate wafer, which is embodied as a carrier substrate wafer, and the growth substrate wafer can be thinned or removed completely. Semiconductor chips which comprise a carrier substrate instead of the growth substrate as a substrate can also be referred to as so-called thin-film semiconductor chips. Furthermore, between the substrate and the semiconductor layer one or more further layers of a material different from a semiconductor material may be arranged, for example, selected from reflector layers, passivation layers, connecting layers.

The substrate wafer and thus also the substrate of the semiconductor chips may comprise or be a semiconductor material, for example, a semiconductor material described above with regard to the semiconductor layer, and/or a ceramic material. For example, the substrate wafer and thus also the substrate of the semiconductor chip can comprise GaAs, GaP, GaN, InP, SiC, Si, Ge, SiN, AlN and mixtures, composite materials and combinations thereof or be made therefrom. In particular, the substrate wafer and thus also the substrate of the semiconductor chip may comprise a material which can be etched by means of a dry etching method, as described below. The substrate wafer and thus the substrate of the semiconductor chip may have a thickness of greater than or equal to 50 μm or preferably greater than or equal to 100 μm.

According to a further embodiment, the substrate wafer and thus also the substrate comprise a top side facing the semiconductor layer and a bottom side opposite the top side. Directions parallel to the top and bottom sides and thus to the main extension plane of the semiconductor layer and the substrate or the substrate wafer are referred to herein and hereinafter as lateral directions, while a direction pointing from the bottom side to the top side is referred to as a vertical direction. In particular, the vertical direction corresponding to the arrangement direction and growth direction of the semiconductor layer may be perpendicular to a plane spanned by the lateral directions.

According to a further embodiment, the substrate has a width B1 in a first lateral direction at the top side and a width B3 in the first lateral direction at the bottom side opposite the top side. At half height between the top and bottom side, the substrate has a width B2 in the first lateral direction. Here, the height is denoted as the extent of the substrate from the bottom to the top side in the vertical direction. Width B2 is thus measured with respect to the vertical direction in the middle between the top and the bottom side. In particular, for widths B1, B2 and B3 the following shall apply: $B1-B2<B2-B3$ and $B1 \geq B2 > B3$.

This can in particular mean that, at least in one lateral direction, the substrate has at the top side the same or a greater width than at half height and that the substrate further has a smaller width at the bottom side than at half height. Furthermore, this means that the difference between width B1 at the top side and width B2 at half height is smaller than the difference between width B2 at half height and width B3 at the bottom side of the substrate, the substrate thus becoming narrower more strongly, from the top side towards the lower side, below the half height than above the half height. If the substrate has at the top side substantially the same width as at half height, the following applies in particular: $B1=B2>B3$, while the following applies in the case where the substrate has the greatest width at the top: $B1>B2>B3$.

According to a further embodiment, the substrate has at least one side surface, which connects the top side and the bottom side to each other, and in which a step is present. In particular, the step can be arranged closer to the bottom side than to the top side, thus below the half height of the substrate. By means of the step it may be possible that the width of the substrate below the half height changes more between the bottom side and the half height than above the half height between the half height and the top side. In particular, the step may have a height which corresponds to the width of the step in the lateral direction, wherein the latter can correspond to width B3.

According to a further embodiment, the step is formed in a laterally circumferential manner. This means in other words that the relations mentioned above and also in the following between widths B1, B2 and B3 apply in each lateral direction. In particular, the substrate may in this case have a pedestal which is enclosed by the laterally circumferential step. The relationships between widths B1, B2 and B3 described above and in the following can therefore in this case also apply, in particular, to the area of the pedestal at the bottom side of the substrate, to the cross-sectional area of the pedestal at half height of the substrate and to the area at the top side of the substrate.

According to a further embodiment, a contact metallization is applied to the bottom side of the substrate. The contact metallization can be designated and embodied, for example, for mounting and/or electrically contacting the semiconductor chip from the bottom side. The contact metallization can comprise for this purpose one or more metals selected from Al, Ag, Au, Pt, Ti, Sn, In, Ni, Cu, Rh and Ir as well as alloys and/or mixtures and/or layer combinations thereof. The contact metallization can preferably have a thickness of a few micrometers, for example, greater than or equal to 2 µm and less than or equal to 4 µm. In particular, the contact metallization can comprise in the first lateral direction, adjacent to the bottom side of the substrate, a width which is equal to width B3. This can mean, in particular, that the contact metallization, at least in the first lateral direction and preferably in all lateral directions, does not protrude beyond the bottom side area of the substrate. Compared to the width of the substrate at half height and the width at the top side of the substrate, the contact metallization can thus be retracted in the lateral direction. If a plurality of semiconductor chips, thus two or more semiconductor chips, is mounted on a carrier, wherein each of the semiconductor chips is mounted on the carrier with the carrier-facing bottom side by means of a connecting layer, directly adjacent semiconductor chips can have a minimum distance A1 to each other, respectively, while the connecting layers of directly adjacent semiconductor chips, according to the extents of the bottom sides and/or the contact metallizations of the semiconductor chips, have a minimum distance A2, wherein the following applies: A1<A2. In other words, the contact metallizations and thus also the connecting layers intended for mounting are spaced apart from each other to a greater extent than the minimum distance between the semiconductor chips, even in case of closely arranged semiconductor chips, so that unwanted electrical connections between adjacent semiconductor chips caused by too closely spaced connecting layers can be avoided. As a result, the risk of so-called electrical bridging can be avoided, even in tightly arranged multi-chip applications.

According to a further embodiment the following applies: $B1-B3 \geq 20$ µm. This means that preferably the difference between the width at the top side and the width at the bottom side of the substrate is greater than or equal to 20 µm. It follows that, in a close assembly of two such semiconductor chips, which almost or even actually touch at least in the region of the top side of the substrate, the bottom sides have a distance of greater than or equal to 20 µm, whereby the previously described advantageous spacing of connecting layers for mounting the semiconductor chips can be achieved. Furthermore, the following may preferably apply: $B1-B2<10$ µm. From the top side to the half height of the substrate, the substrate thus preferably has the smallest possible beveling of the side surface.

Particularly preferably the following can furthermore apply: $B2-B3>X \times (B1-B2)$ with X=2 or 3 or 5 or 10.

This may in particular mean that the width of the substrate decreases from the half height to the bottom side by more than a factor of 2, 3, 5 or 10 than from the top side to the half height of the substrate.

According to a further embodiment, the separation of the substrate wafer and the semiconductor layer for the production of individual semiconductor chips is performed by means of an etching process. In particular, it can be possible that at least for the purpose of separating the substrate wafer and the semiconductor layer only a separation process based on etching is used. In particular, the separation process can have multiple steps and comprise a first etching process and a second etching process. In particular, by means of the separation process, a plurality of trenches can be produced next to one another in the semiconductor layer and the substrate wafer, said plurality of trenches separating the semiconductor layer and the substrate wafer into a plurality of semiconductor chips. The plurality of trenches may in particular form a grid arrangement of the trenches, which divide the semiconductor layer and the substrate wafer into separate parts forming the semiconductor chips. In the following, the separation process will be explained with reference to at least one first and second trench, which together form a separation trench which extends through the semiconductor layer and the substrate wafer. Correspondingly, according to the description above, a variety of first and second trenches can be generated for splitting the semiconductor layer and the substrate wafer up into a plurality of semiconductor chips.

According to a further embodiment, when severing the substrate wafer and the semiconductor layer, a first etching process is performed for forming at least a first trench, which extends through the semiconductor layer and a portion of the substrate wafer. The first etching process is thus carried out from the side of the semiconductor layer and serves to generate the first trench for the separation of the semiconductor layer and a part of the substrate wafer from its top side.

The first etching process may in particular be an anisotropic etching process, which may be distinguished by etching more in the vertical direction than in the lateral direction, so that preferably a relatively narrow first trench can be produced. In particular, the first etching process can comprise deep reactive ion etching or be such a method. Deep reactive ion etching (DRIE) is a highly anisotropic dry etching process, by means of which a high aspect ratio can be produced, i.e., a ratio of trench depth to trench width of up to 50:1. For this purpose, a two-stage alternating dry etching process is used in which etching and passivation steps alternate. For this purpose, a mask can be applied to the semiconductor layer, for example, comprising a photoresist or a hard mask, for instance with silicon dioxide, silicon nitride or other materials that cover all areas of the semiconductor layer and the substrate wafer that are not to be etched. By means of plasma-assisted dry etching with a suitable etchant such as sulfur hexafluoride in a carrier gas, such as argon, in a first etching step at least a portion of the semiconductor layer or of the semiconductor layer and the substrate wafer is etched. The etching step is interrupted after a short time, and a fluorine-containing gas mixture, for example, octafluorocyclobutane and argon or $CF_4$ and $H_2$, are added, which are activated in the plasma and form a passivation layer on all free surfaces. In particular, a passivation layer with a fluorine-containing polymer is produced. In this way, sidewalls of the already etched first trench can be protected against further chemical material removal, so that it is possible that, in a subsequently repeated etching step, the passivation layer and thus also to-be-removed material of the semiconductor layer and/or the substrate wafer at the trench bottom is removed much faster than on the sidewalls of the trench, by means of which in turn it is possible to etch in a more vertical than lateral direction. By repeating etching and passivation steps, a desired depth of the first trench with a relatively small width can be achieved. By means of such a method, a lamellar or wave-like surface structure of the trench side surfaces and thus of the side surfaces of the later finished semiconductor chips is affected. The above and in the following described widths in the region of such lamellar or wave-like structures refer to widths averaged over one or more wave structures, wherein the width variations due to such structures are negligible compared to the values of the substrate widths.

Furthermore, after formation of the first trench, a second etching process is performed to form at least one second trench, which adjoins the first trench, especially at its bottom, and which completely severs the substrate wafer. In particular, the second etching process is performed from the same side as the first etching process, wherein the second trench continues the first trench in the vertical direction. In particular, the second etching process may be an isotropic etching process, such that, as the depth of the second trench increases, compared with the anisotropic first etching process a larger trench width can be achieved. By means of this, the first trench can have a maximum width B4 in the lateral direction and the second trench can have, on a bottom side of the substrate wafer, a width B5 after the complete severing of the substrate wafer, wherein the following applies: $B5>B4$.

According to a further embodiment, before the separation of the substrate wafer and the semiconductor layer, a contact metallization is applied to the bottom side of the substrate wafer facing away from the semiconductor layer. The contact metallization remains continuous during the performance of the separation process for the separation of the substrate wafer and the semiconductor layer and is preferably severed only after the separation process itself.

By means of the method described here, a separation of the substrate wafer and thus a chip singulation is possible by means of an etching process instead of a conventional laser separation method. By avoiding the disadvantages of laser separation methods, for example, the breaking strength of the semiconductor chips produced in this way can be significantly increased. In particular, the breaking strength of semiconductor chips can be increased with substrates whose thermal expansion coefficient is not matched to the thermal expansion coefficient of the semiconductor material of the semiconductor layer, since, compared to laser separation methods, no significant heating during singulation takes place. In addition, it may be possible to produce a very small undercut, in particular of less than or equal to 5 µm, or no undercut at all in the substrate wafer and thus the substrate on the side facing the semiconductor.

By means of the two-stage etching process a partial broadening of the separation trench, in particular in the region of the interface to the contact metallization on the bottom side of the substrate wafer, is produced, so that a semiconductor chip is produced whose substrate, in the manner described above, is wider at the side facing the semiconductor layer than at the side facing away from the semiconductor layer. In particular, the difference in the width of the substrate between the side facing the semiconductor layer and the half height is preferably significantly smaller than the difference between the width of the substrate at half height and the width of the substrate on the side facing away from the semiconductor layer. Thus, at the same time a contact metallization on the bottom side of the substrate is drawn back compared to the chip top edge. This can also generate a reservoir for excess material of a connecting layer, i.e., for example, a solder metal or an adhesive, whereby, for example, in the case of a solder metal, a reduction of the so-called "solder bulgings" can be achieved. In addition, by the described etching process, the side surface and the chip edge are free of typical damages caused by laser cutting, so that, as described, the breaking force of the semiconductor chips can be significantly increased.

Since, as a result of the process during the first etching process, a fluoropolymer is deposited as a passivation on the side surfaces of the semiconductor chip, a protection of the side surfaces of the semiconductor chip can be achieved. Furthermore, the passivation can deliberately be used and/or modified to increase the adhesion and surface wetting of, for example, adhesive, solder, potting or lens materials such as epoxy, silicone and the like. In addition, it may also be possible to remove the passivation at least in places or completely from the chip side surfaces.

BRIEF DESCRIPTION OF THE DRAWINGS

Further advantages, advantageous embodiments and further developments are revealed by the embodiments described below in connection with the figures, in which.

In the embodiments and figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

Figure 1A:
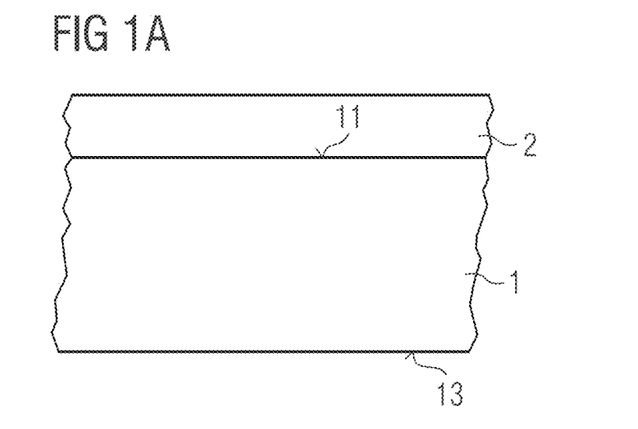
FIGS. 1A to 1F show schematic representations of process steps of a method for producing a semiconductor chip as well as schematic representations of a semiconductor chip according to an embodiment.

In connection with FIGS. 1A to 1F, a method for producing a semiconductor chip 100 and features of the semiconductor chip 100 are described. For this purpose, in a first method step, as shown in FIG. 1A, a substrate wafer 1, shown in a partial view, is provided with a semiconductor layer 2 applied thereon in large-area fashion. In particular, the substrate wafer 1 has a top side 11 facing the semiconductor layer and a bottom side 13 facing away from the semiconductor layer 2. The semiconductor layer 2, which can also be embodied as a semiconductor layer sequence with a plurality of semiconductor layers according to the description in the general part, can be grown on the top side 11 of the substrate wafer. Alternatively, it may also be possible that the semiconductor layer 2 has been grown on a growth substrate wafer and afterwards has been transferred onto the substrate wafer 1 formed by a carrier substrate wafer. Accordingly, the substrate wafer 1 may be either a growth substrate wafer or a carrier substrate wafer. The substrate wafer 1 comprises a material as described above in the general part, in particular a material suitable for the etching process steps described in the following, for example, a semiconductor material such as silicon or GaP or a ceramic material. In addition to the semiconductor layer 2, further layers may be applied to the substrate wafer 1 and/or the semiconductor layer 2, such as passivation layers and/or contact layers such as contact metallizations.

In a further method step, the substrate wafer 1 and the semiconductor layer 2 applied thereto are severed. In particular, a plurality of semiconductor chips such as the semiconductor chip 100 explained in more detail in connection with FIGS. 1D to 1F is produced by the severing. Therefore, instead of the one separation trench shown purely by way of example in FIGS. 1B and 1C, a plurality of trenches arranged next to each another is preferably produced, in particular in a lattice-like arrangement, in the semiconductor layer 2 and in the substrate wafer 1.

Figure 1B:
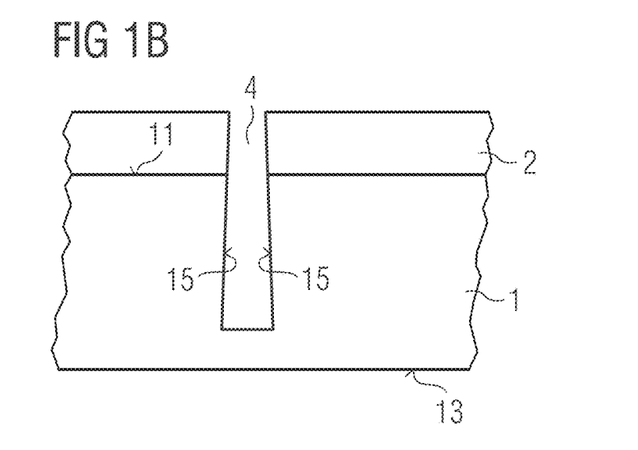

In a first etching process, as shown in FIG. 1B, a first trench 4 is produced from the side of the semiconductor layer 2 and the top side 11, said trench extending through the semiconductor layer 2 and a portion of the substrate wafer 1. The first etching process is, in particular, an anisotropic etching process, which makes it possible to produce a trench 4 with a high aspect ratio, i.e., a large ratio of trench depth to trench width. For this purpose, as a first etching process deep reactive ion etching is used, which is explained in greater detail above in the general part. This makes it possible to achieve a relatively low undercut of the top side 11 of the substrate wafer 1, i.e., a relatively small broadening of the first trench 4 with increasing depth. The side surfaces of the trench 4 form parts of the side surfaces 15 of the later-finished semiconductor chips 100. The anisotropic first etching process is carried out, in particular, until the substrate wafer 1 is severed more than halfway from the top side 11.

Figure 1C:
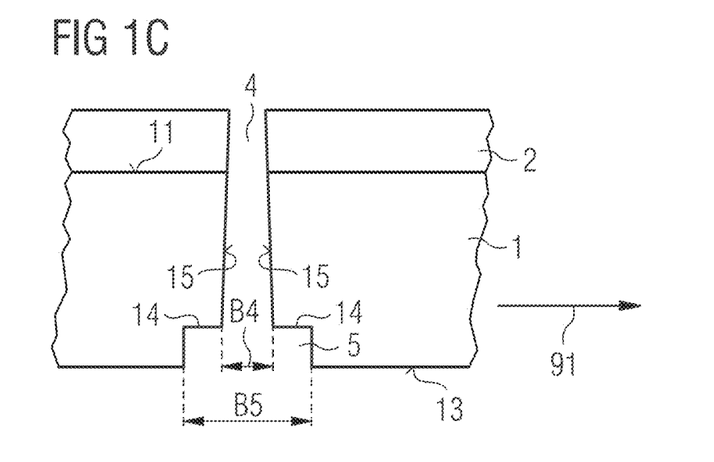
Figure 1D:
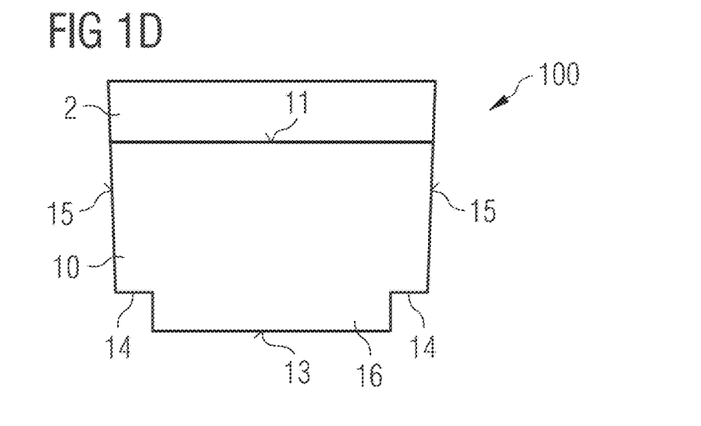
Figure 1E:
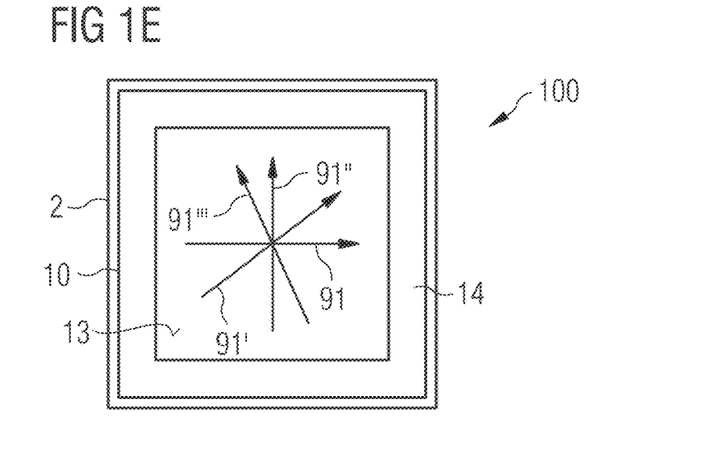
Figure 1F:
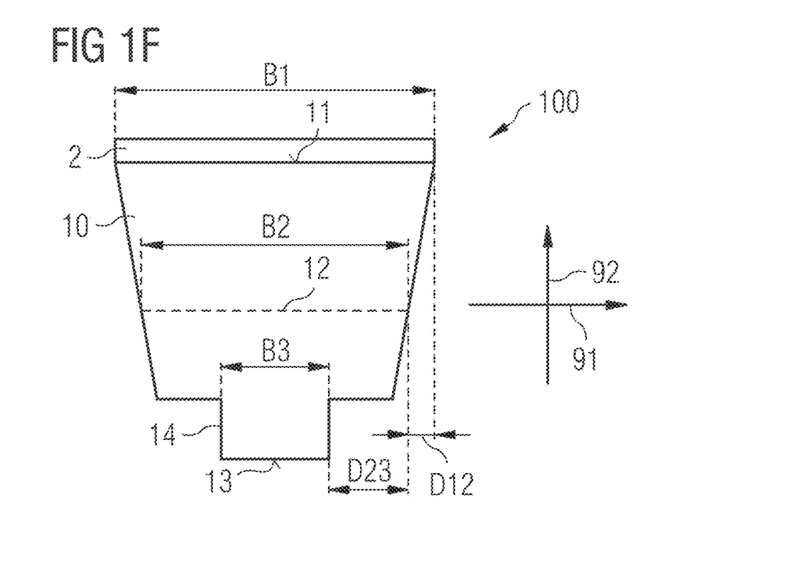

In a second etching process, as shown in FIG. 1C, a second trench 5 is created, which adjoins the first trench 4 and by which the substrate wafer 1 is completely severed. The second trench 5 thus continues the first trench 4 downwards in the vertical direction and, together with the first trench 4, forms the separation trench which completely severs the semiconductor layer 2 and the substrate wafer 1.

The second etching process comprises, in particular, an isotropic etching process, so that a partial broadening of the separation trench toward the bottom side 13 of the substrate wafer can be achieved. That means that in a lateral direction 91, which is indicated in FIG. 1C, the first trench 4 has a maximum width which, in the shown embodiment, slightly increases with increasing distance to the top side 11 of the substrate wafer 1 down to the lower edge of the first trench 4. At the lower edge of the first trench 4 the first trench thus has a maximum width B4. The second trench 5 has, at the bottom side 13, a width B5, which is greater than width B4. Accordingly, a step 14 is formed in the substrate wafer 1 at the side surfaces 15 of the later semiconductor chips 100, said step being closer to the bottom side 13 than to the top side 11 of the substrate wafer 1.

A semiconductor chip 100, which is produced by the described separation, is shown in FIG. 1D. This semiconductor chip has a substrate 10, which is produced by the severing of the substrate wafer 1, and which has side surfaces 15, which are produced by the described etching process. In particular, as previously described, the semiconductor chip 100 has a step 14 in the side surfaces 15 which is closer to the bottom side 13 than to the top side 11. As described in the general part, the described etching process can avoid the disadvantages which are caused by laser separation methods.

In FIG. 1E a view onto the bottom side 13 of the semiconductor chip 100 is shown. As illustrated, the step 14 is formed laterally circumferential, i.e., in each lateral direction, wherein purely by way of example four different lateral directions 91, 91', 91", 91''' are shown. Thus, the substrate 10 has a pedestal 16, which is enclosed by the step 14, and whose surface forms the bottom side 13 of the semiconductor chip 100.

In FIG. 1F a schematic representation of the described semiconductor chip 100 is shown with dimensions. The semiconductor chip 100 has a width B1 at the top side 11 of the substrate 10 and a width B3 at the bottom side 13 of the substrate 11. At half height 12, which is indicated by the horizontal dashed line, the semiconductor chip 100 has a width B2. The half height here corresponds to half the distance between the top side 11 and the bottom side 13 in the indicated vertical direction 92. The widths B1, B2 and B3 are measured in a first lateral direction 91, wherein the relationships described in the following can apply in several lateral directions or in all lateral directions, in particular for the formation of a previously described pedestal 16.

For widths B1, B2 and B3 the following applies: B1−B2<B2−B3 and B1≥B2>B3.

If, as illustrated in the figures shown here, during the first etching process a broadening of the first trench 4 with increasing depth, which is measured from the top side 11, is generated, in particular B1>B2>B3 applies.

The thickness of the substrate 10, that is to say its dimension in the vertical direction 92, can preferably be greater than or equal to 50 μm and, in particular, greater than or equal to 100 μm. Particularly preferably B1−B3≥20 μm and preferably B1−B3≥25 μm may apply, so that even in a very tight arrangement of two such semiconductor chips 100 directly adjacent to each other their bottom sides 13 have a distance of at least 20 μm or preferably of at least 25 μm to each other. Furthermore, preferably B1−B2≤10 μm applies and, in this context, also B2−B3>X×(B1−B2) with X=2 or 3 or 5 or 10. In other words, this means that the difference in the width of the substrate 10 between the top side 11 and the half height 12 is significantly smaller than the difference between the width of the substrate 10 at half height 12 and the width at the bottom side 13. This can also be expressed by way of the parameters D12 and D23 indicated in FIG. 1F, which are each a measure of the overhang or the taper of the substrate 10, with D12=(B1−B2)/2 and D23=(B2−B3)/2. According to the previous specifications D12<D23 applies. Taking into account the quantitative specifications given above, accordingly D12≤5 μm and D12+D23≥10 μm as well as D23>X×D12 with X=2, 3, 5 or 10 apply. Furthermore, D12 can preferably be greater than or equal to 0 μm or greater than or equal to 2 μm or greater than or equal to 4 μm and less than or equal to 10 μm or less than or equal to 7 μm, while D23 can be preferably greater than or equal to 10 μm and less than or equal to 15 μm. The height of step 14, measured from the bottom side 13, can furthermore preferably correspond approximately to D23. This means that the height of step 14 and D23 deviate from each other by less than 20% or less than 10% or even less than 5%.

In connection with FIGS. 2A to 2E, a further embodiment of a method for producing a semiconductor chip 100 and for a correspondingly produced semiconductor chip 100 is shown, in which, in comparison to the previous embodiment, a contact metallization 3 is applied on the semiconductor layer 2 opposite the bottom side 13 of the substrate wafer 1 before severing the substrate wafer 1 and the semiconductor layer 2. This contact metallization has a thickness of greater than or equal to 1 μm and less than or equal to 5 μm and preferably of about 3 μm.

Figure 2A:
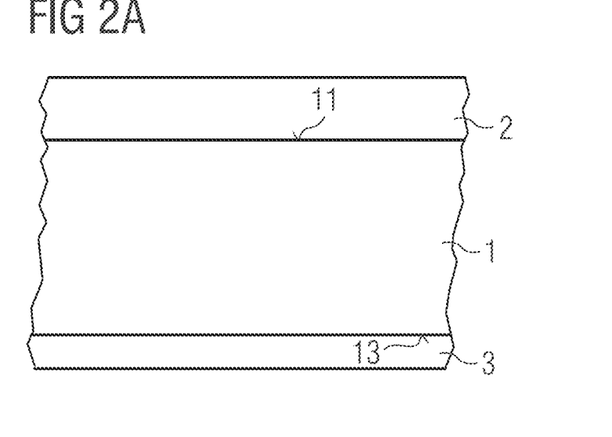
FIGS. 2A to 2E show schematic representations of process steps of a method for producing a semiconductor chip according to another embodiment.
Figure 2B:
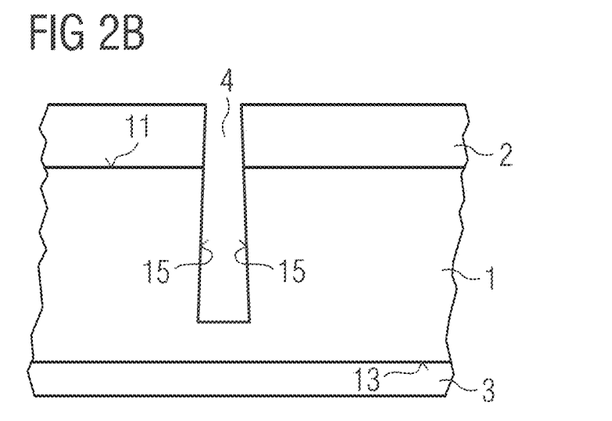
Figure 2C:
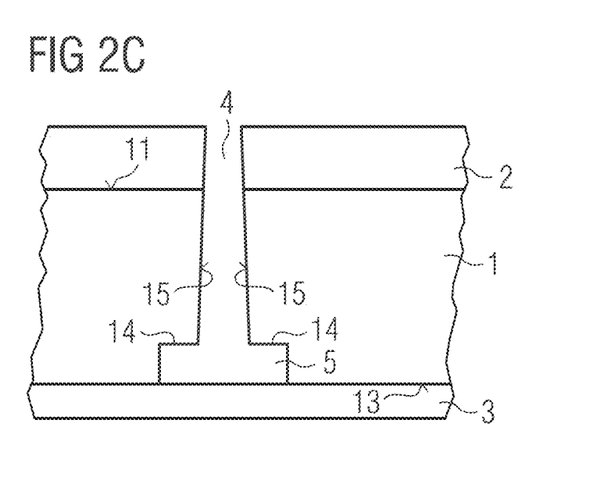
Figure 2D:
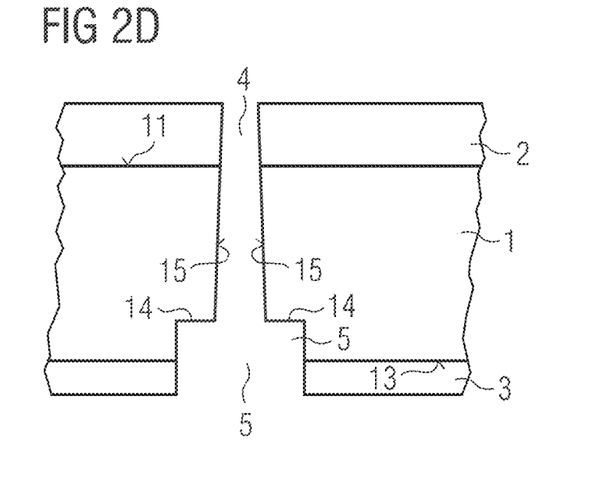

The process steps shown in FIGS. 2B and 2C for producing the first trench 4 and the second trench 5 for severing the substrate wafer 1 and the semiconductor layer 2 correspond to the method steps as described above in connection with FIGS. 1B and 1C. During the separation of the substrate wafer 1 and the semiconductor layer 2, the contact metallization 3 remains continuous and is also severed only after the separation of the substrate wafer 1 and the semiconductor layer 2, as shown in FIG. 2D. In particular, the contact metallization 3 is severed in such way that it is removed in the second trench 5, so that the contact metallization 3 adjacent to the bottom side 13 does not protrude beyond the latter into the trench 2.

Figure 2E:
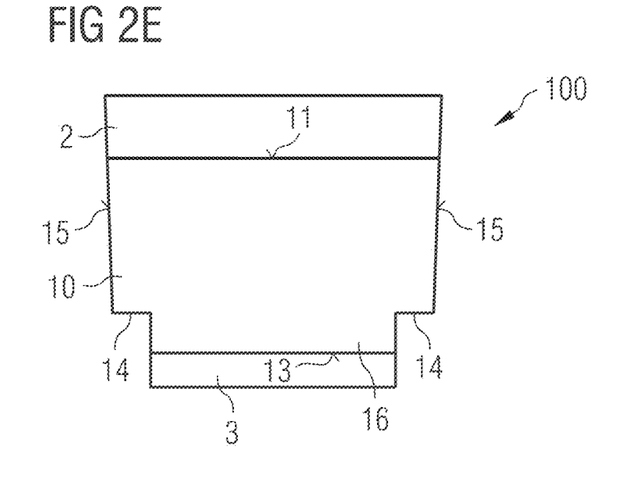

FIG. 2E shows a correspondingly produced semiconductor chip 100, which corresponds to the semiconductor chip 100 described in connection with FIGS. 1D to 1F, wherein the contact metallization 3 is additionally applied to the bottom side 13.

According to the above-described removal of the contact metallization 3 in the second trench 5, the contact metallization 3 comprises, adjacent to the bottom side 13 in the lateral direction, a width corresponding to the width of the bottom side 13, i.e., the width B3 described above in connection with FIG. 1f. In particular, this applies preferably to all lateral directions, so that the contact metallization preferably does not protrude beyond the bottom side 13 in any lateral direction.

Figure 3A:
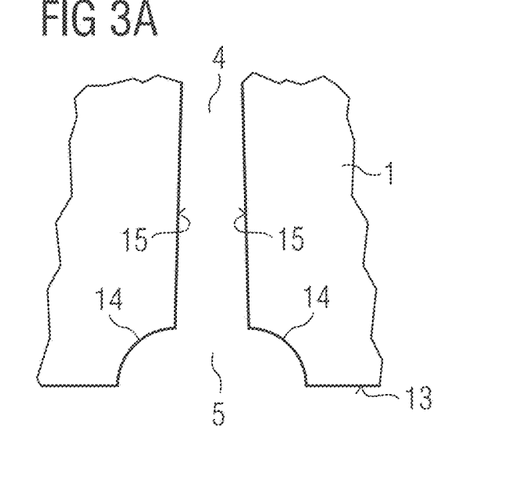
FIGS. 3A to 3C show schematic representations of further features of the method and the semiconductor chip according to other embodiments.
Figure 3B:
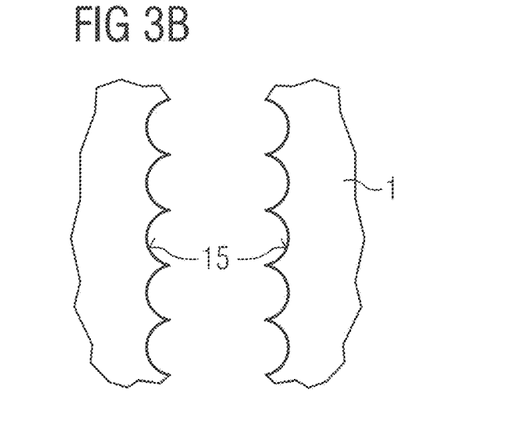
Figure 3C:
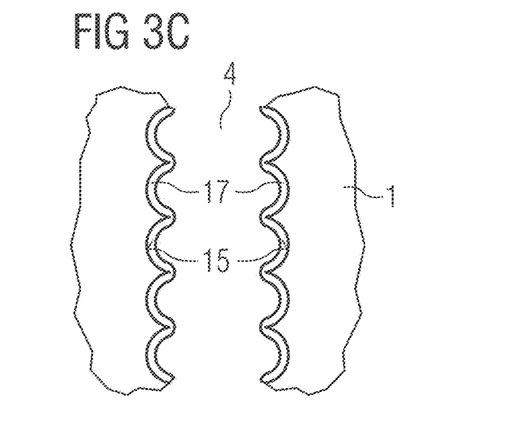

In FIGS. 3A to 3C, further features of the described method are shown according to further embodiments. In particular, as shown in FIG. 3A, the second trench 5 may have a rounded stepped shape rather than a more angular stepped shape. The shape of the second trench 5 and thus the shape of the step 14 can be adjusted in particular by a suitable choice of the process parameters during the production of the second trench 5, i.e., in particular by a choice of suitable etching parameters.

As further shown in FIG. 3B, the side surface 15 in the first trench 4, which also corresponds to the later corresponding side surface 15 of the semiconductor chip 100, may have a lamellar or wave-like structure, which can be effected by the sub-steps described above in the general part during the execution of the production of the first trench 4.

As shown in FIG. 3C, a passivation 17 can be applied to the side surface 15, which can also be produced by the method steps described above in the general part during the production of the first trench 4. In particular, the passivation 17 may therefore comprise or be a layer with a fluoropolymer. In particular, it may thus be possible for the passivation 17 to be present only on the side surface of the first trench 4, but not on the side surface of the second trench 5 and thus not in the region of the step 14 and not adjacent to the bottom side 13. Accordingly, this also applies to the semiconductor chip 100.

The passivation 17 may remain on the semiconductor chip 100 and, in this way, can deliberately be used for adhesion and/or surface wetting, for example, of adhesive, solder, potting or lens materials such as epoxy or silicone. Furthermore, the passivation 17 can also be modified to set desired wetting properties. Moreover, it may also be possible that the passivation 17 is at least partially or completely removed from the side surface 15.

Figure 4:
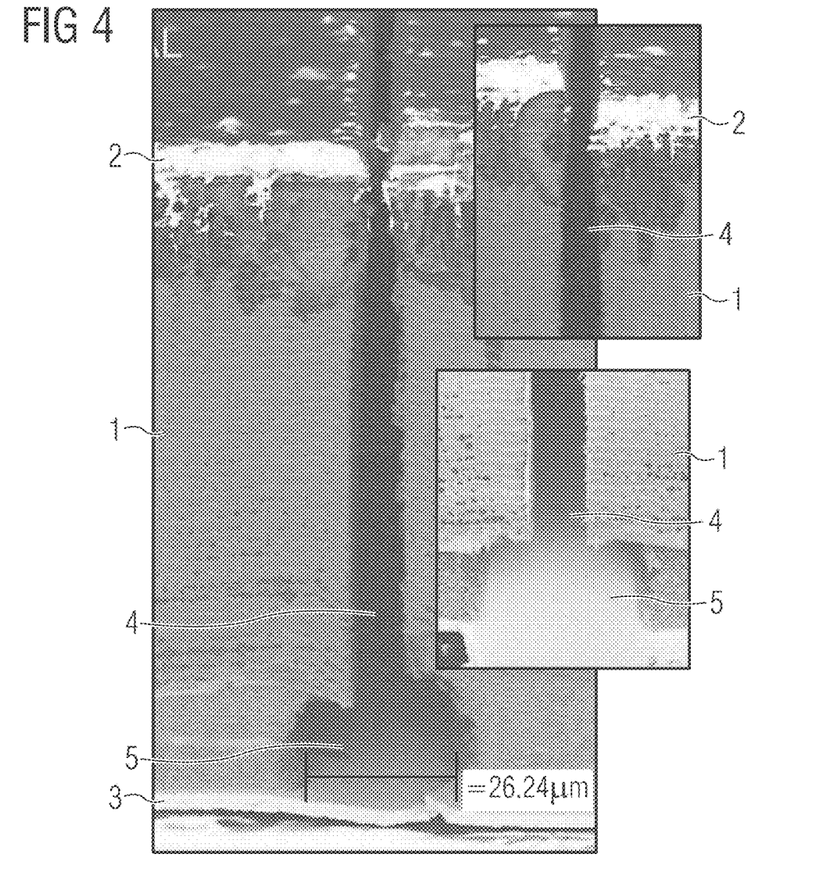
FIG. 4 shows a recording of an electron microscope after a method step according to another embodiment.

In FIG. 4 an electron microscope recording of a state during the production of semiconductor chips is shown which corresponds to the process step shown in FIG. 2C. The two sectional views in the right-hand side of the image show in an enlarged view the region of the first trench 4 and the semiconductor layer 2 (top sectional view) and the region around the second trench 5 (lower sectional view). The width of the second trench 5 is about 24 μm in this embodiment. In the area of the first trench 4, the lamellar or wave-like structure can also be seen well at the side surfaces of the trench, as described in connection with FIGS. 3B and 3C.

Figure 5:
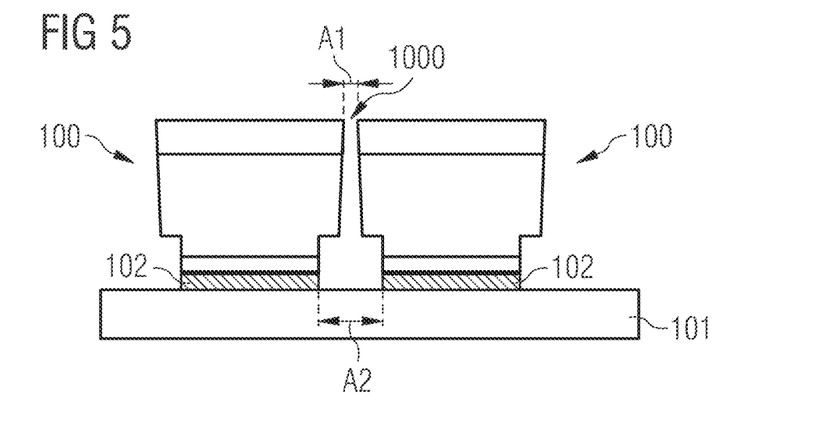
FIG. 5 shows an apparatus comprising a plurality of semiconductor chips according to another embodiment.

In FIG. 5 an apparatus 1000 is shown, which has, on a carrier 101, a plurality of semiconductor chips 100 which may be embodied according to one of the embodiments described above. The carrier 101 may be, for example, a printed circuit board, a ceramic carrier, a component housing such as a QFN package, a lead frame, or the like. The semiconductor chips 100 are each mounted on the carrier by means of connecting layers 102, wherein the connecting layers 102 may be, for example, a glue or a solder. By means of the structure of the semiconductor chips 100 as described above, it is possible that directly adjacent semiconductor chips 100 each have a minimum distance A1 to each other, which, for example, can correspond to the spacing of the chip top edges to one another, while the connecting layers 102 of the directly adjacent semiconductor chips 100 have a minimum distance A2, where A1<A2. As a result, it is possible to mount the semiconductor chips 100 very closely next to one another on the carrier 101, without causing a so-called bridging, i.e., an electrical connection between semiconductor chips 100 caused by the connection layers 102. Alternatively to the shown embodiment, more than two semiconductor chips may be mounted on the carrier 101.

By means of the step near the bottom side of the semiconductor chips 100 also a reservoir may be formed for excess solder or adhesive of the connecting layers 102, so that in the case of solder the problem of so-called solder bulging can be avoided.

The embodiments described in the figures can also be combined with each other according to further embodiments, even if such combinations are not explicitly described. In addition, the embodiments described in the figures can comprise further or alternative features according to the embodiments and features described in the general part.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A method for producing a semiconductor chip, wherein the semiconductor chip comprises a substrate and a semiconductor layer arranged at the substrate, wherein the substrate comprises, at a side facing the semiconductor layer, a top side with a width B1 in a first lateral direction and, at a side opposite to the top side, a bottom side with a width B3 in the first lateral direction, wherein the substrate has a width B2 in the first lateral direction at a half height between the top side and the bottom side, and wherein the following applies to the widths B1, B2 and B3: B1−B2<B2−B3, and B1≥B2>B3, the method comprising:
    providing a substrate wafer with a semiconductor layer applied thereon in large-area fashion; and
    severing the substrate wafer and the semiconductor layer to form individual semiconductor chips comprising:
        performing a first etching process for forming at least one first trench, which extends through the semiconductor layer and part of the substrate wafer; and
        performing a second etching process to form a second trench, which adjoins the first trench, in order to completely separate the substrate wafer,
    wherein the first trench, in the lateral direction, has a maximum width B4 and the second trench has a width B5 at a bottom side of the substrate wafer, and
    wherein B5>B4.

2. The method according to claim 1, wherein the first etching process is an anisotropic etching process and the second etching process is an isotropic etching process.

3. The method according to claim 2, wherein the first etching process comprises deep reactive ion etching.

4. The method according to claim 1, further comprising, prior to severing the substrate wafer, applying a contact metallization to a bottom side of the substrate wafer, the bottom side of the substrate wafer facing away from the semiconductor layer.

5. The method according to claim 4, wherein, while severing the substrate wafer, the contact metallization remains continuous and is severed only after severing the substrate wafer.

6. The method according to claim 1, wherein B1>B2>B3.

7. The method according to claim 1, wherein the substrate comprises a step in a side surface and the step is located closer to the bottom side than to the top side.

8. The method according to claim 7, wherein the step is embodied laterally circumferential.

9. The method according to claim 8, wherein the substrate comprises a pedestal enclosed by the step.

10. The method according to claim 1, further comprising a contact metallization arranged on the bottom side.

11. The method according to claim 10, wherein the contact metallization has, adjacent to the bottom side, in the first lateral direction, a width equal to width B3.

12. The method according to claim 1, wherein the following applies: B1−B3≥20 μm.

13. The method according to claim 1, wherein the following applies: B1−B2≤10 μm.

14. The method according to claim 1, wherein the following applies:

$$B2-B3>2\times(B1-B2).$$

15. The method according to claim 1, wherein for the widths B1, B2 and B3 in all lateral directions the following applies:

$$B1-B2<B2-B3, \text{ and}$$

$$B1\geq B2>B3.$$

* * * * *